United States Patent
Sudo (10) Patent No.: US 8,331,151 B2
(45) Date of Patent: Dec. 11, 2012

(54) SEMICONDUCTOR MEMORY INCLUDING CONTROL UNIT RESPONSIVE TO ERASE COMMAND TO DETERMINE SELECTION OF REDUNDANT MEMORY BLOCK

(75) Inventor: Naoaki Sudo, Yokohama (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 88 days.

(21) Appl. No.: 12/965,951

(22) Filed: Dec. 13, 2010

(65) Prior Publication Data

US 2011/0157985 A1    Jun. 30, 2011

(30) Foreign Application Priority Data

Dec. 25, 2009  (JP) .................................. 2009-294115
Mar. 30, 2010  (KR) ........................ 10-2010-0028656

(51) Int. Cl.
*G11C 11/34* (2006.01)
*G11C 16/04* (2006.01)

(52) U.S. Cl. ................ 365/185.09; 365/185.29; 365/200

(58) Field of Classification Search ......... 365/185.09 O, 365/185.29 X, 200 X; 714/718, E11.145
See application file for complete search history.

(56) References Cited

U.S. PATENT DOCUMENTS 6,262,926 B1 * 7/2001 Nakai ........................... 365/200

FOREIGN PATENT DOCUMENTS

| JP | 08-031196 | 2/1996 |
| JP | 2006-134310 | 5/2006 |
| WO | 01/22232 A1 | 3/2001 |

* cited by examiner

*Primary Examiner* — VanThu Nguyen
(74) *Attorney, Agent, or Firm* — Volentine & Whitt, PLLC (57) ABSTRACT

A semiconductor memory device includes a memory region including memory cells configured to store data, a redundant region including memory cells configured to store data, and a control unit. The control unit is responsive to an erase command to execute, prior to an erase operation corresponding to the erase command, an error detection operation on data read from the memory region to detect whether the memory region is a defective memory region to be replaced by the redundant region.

12 Claims, 8 Drawing Sheets

SEMICONDUCTOR MEMORY INCLUDING CONTROL UNIT RESPONSIVE TO ERASE COMMAND TO DETERMINE SELECTION OF REDUNDANT MEMORY BLOCK

CROSS-REFERENCE TO RELATED APPLICATIONS

A claim of priority under 35 U.S.C. §119 is made to Japanese Patent Application No. 2009-294115, filed on Dec. 25, 2009, and to Korean Patent Application No. 10-2010-0028656, filed on Mar. 30, 2010, the entire contents of which are hereby incorporated by reference.

BACKGROUND

The disclosure herein generally relates to semiconductor memory devices, and more particularly, the disclosure relates to nonvolatile semiconductor memory devices equipped with error correction code (ECC) functionality.

Semiconductor memory devices are memory devices implemented using semiconductors such as silicon (Si), germanium (Ge), gallium arsenide (GaAs), and indium phosphide (InP). The semiconductor memory devices are generally classified as either volatile memory devices or nonvolatile memory devices.

Volatile memory devices are characterized by the loss of stored data when power supply thereto is interrupted. Examples of the volatile memory devices include static random-access memory (SRAM) devices, dynamic random-access memory (DRAM) devices, and synchronous dynamic random-access memory (SDRAM) devices. On the other hand, nonvolatile memory devices are characterized by the retention of stored data stored when power supply thereto is interrupted. Examples of the nonvolatile memory devices include read-only memory (ROM) devices, programmable read-only memory (PROM) devices, electrically programmable read-only memory (EPROM) devices, electrically erasable and programmable read-only memory (EEPROM) devices, flash memory devices, phase-change random-access memory (PRAM) devices, magnetic random-access memory (MRAM) devices, resistive random-access memory (RRAM) devices, and ferroelectric random-access memory (FRAM) devices. Among these, flash memory devices are generally classified as either NOR-type flash memory devices or NAND-type flash memory devices depending on connection scheme of memory cells within the devices.

In electrically erasable and programmable nonvolatile semiconductor memory devices such as EEPROM devices and flash memory devices, the operational characteristics of a memory cell degrade over time as they are subjected to repeated write/erase operations. Therefore, a memory cell may malfunction when written or erased a number of times in excess of a count limit. An error correction code (ECC) is utilized at least in part to correct an error resulting from a malfunctioning memory cell, thus effectively increasing the write/erase count limit of the memory cell.

Typically, error correction by an ECC requires a memory cell region for storing data (information bits) and a parity cell region for storing check bits (parity bits) (hereinafter, both of the two regions are referred to as an erase block). An increase in the number of parity cells may increase the number of error-correctable bits. However, the chip size may also increase with an increase in the number of parity cells. Thus, a scheme of replacing an erase block in which the number of detected error bits exceeds the number of error-correctable bits (hereinafter referred to as an ECC overflow block) with a redundant block is used to limit the number of error-correctable bits. See, for example, Japanese Patent Application Laid-Open No. 8-31196, International Patent Application Publication No. 01/022232, and Japanese Patent Application Laid-Open No. 2006-134310.

SUMMARY

According to an aspect of the inventive concepts, a semiconductor memory device is provided which includes a memory region including memory cells configured to store data, a redundant region including memory cells configured to store data, and a control unit. The control unit is responsive to an erase command to execute, prior to an erase operation corresponding to the erase command, an error detection operation on data read from the memory region to detect whether the memory region is a defective memory region to be replaced by the redundant region.

According to another aspect of the inventive concepts, a semiconductor memory device is provided which includes a memory cell array including a memory region and a redundant region, a decoder for selecting memory blocks of the memory cell array according to an external address, and a control unit. The control unit is responsive to an erase command to detect that the memory region is a defective memory region, before execution of an erase operation corresponding to the erase command, and to control the decoder to replace the defective memory region with the redundant region.

According to still another aspect of the inventive concepts, a semiconductor memory device is provided which includes a main memory block, a redundant memory block, and a control unit. The control unit is responsive to an erase command to determine, before execution of an erase operation corresponding to the erase command, whether the main memory block is defective, and to interrupt an access to the main memory block and select the redundant memory block when the main memory block is determined to be defective.

BRIEF DESCRIPTION OF THE DRAWINGS

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts. In the drawings.

DETAILED DESCRIPTION OF THE EMBODIMENTS

Preferred embodiments of the inventive concepts will be described below in more detail with reference to the accompanying drawings. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art.

Figure 1:
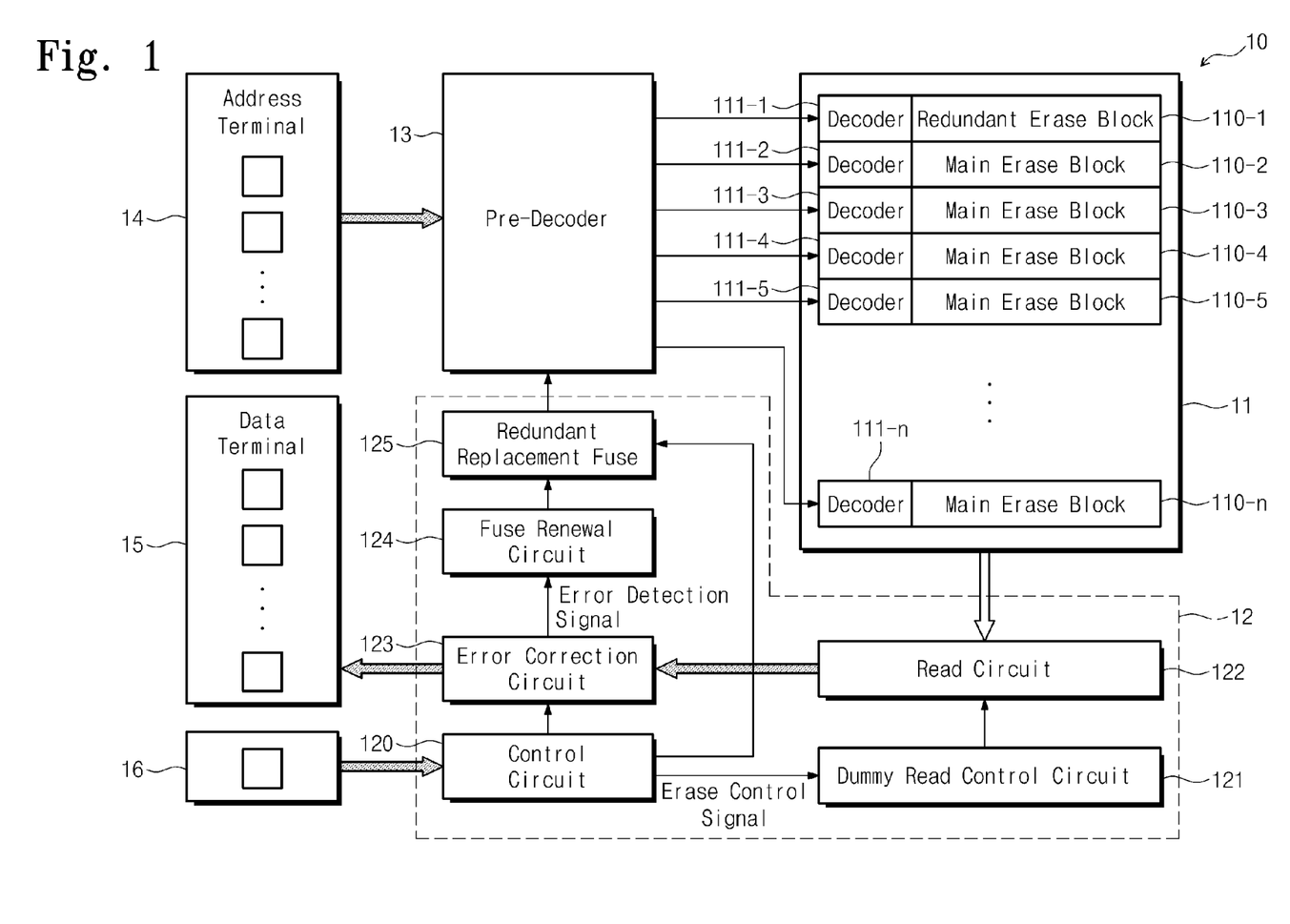
FIG. 1 is a block diagram of a semiconductor memory device according to an exemplary embodiment of the inventive concepts.

FIG. 1 is a block diagram of a semiconductor memory device according to an exemplary embodiment of the inventive concepts.

Referring to FIG. 1, a semiconductor memory device 10 of this example includes a memory cell array 11, a control unit 12, a pre-decoder 13, an address terminal 14, a data output terminal 15, and a command input terminal 16.

In operation, the semiconductor memory device 10 reads data from an erase block of the memory cell array 11 in a first interval of an erase operation on a memory cell (a dummy read operation). Herein, when detecting an error of m bits which exceeds the error-correctable n bits (m>n) in each error correction unit, the semiconductor memory device 10 memorizes/stores/retains the coordinates of an erase block (address information in the event of specifying the corresponding block by an external address).

Upon completion of the dummy read operation, the semiconductor memory device 10 performs an erase operation on data of an erase block. If an error-uncorrectable erase block is selected by the external address information when a read/write/erase operation is performed after replacement of an error correction code (ECC) overflow block with a redundant erase block 110-1, the semiconductor memory device 10 selects the redundant erase block 110-1 instead of the error-uncorrectable erase block. That is, the semiconductor memory device 10 performs a read/write/erase operation on the redundant erase block 110-1.

The memory cell array 11 includes a redundant erase block 110-1, main erase blocks 110-2~110-n, and decoders 111-1~111-n connected respectively to the erase blocks 110-1~110-n. The main erase blocks 110-2~110-n each constitute a memory region with nonvolatile memory cells arranged therein. The main erase blocks 110-2~110-n memorize/store/retain data received from an external device of the semiconductor memory device 10. The main erase block is a block unit that is batch-erasable in response to the input of an erase command. The redundant erase block 110-1 is a redundant region that replaces a defective region if one of the main erase blocks 110-2~110-n becomes a defective region (in the case of a defective memory region with error-uncorrectable bits).

Like the main erase blocks 110-2~110-n, the redundant erase block 110-1 is a memory region with nonvolatile memory cells arranged therein. For the sake of simplicity, a single redundant erase block 110-1 is illustrated in an exemplary embodiment of the inventive concepts. However, those skilled in the art will readily understand that the semiconductor memory device is not limited in this fashion, and that instead a plurality of redundant erase blocks may be provided.

The redundant erase block 110-1 and the main erase blocks 110-2~110-n may also include a parity cell region for storing check bits (parity bits), as well as a memory cell region for storing data (information bits) received from an external device. As an exemplary embodiment of the inventive concepts, it is assumed that a parity cell region is included in the erase blocks. However, the inventive concepts are not limited thereto, and a dedicated memory cell array may instead be provided for the parity cell region.

The decoders 111-1~111-n respectively adjacent to the erase blocks 110-1~110-n are row decoders and column decoders. Each of the decoders 111-1~111-n is a circuit that selects a corresponding memory cell according to a row address and a column address received from the pre-decoder 13. That is, each of the decoders 111-1~111-n selects a corresponding erase block and memory cells (a data cell and a parity cell) of the corresponding erase block according to an externally provided address in response to a control command of a control circuit 120.

The control circuit 120 generates an internal command signal by decoding an external command signal (e.g., a read/write/erase command signal) received from an external device. That is, the control circuit 120 outputs an external command signal in response to an external command signal to control the circuits in the semiconductor memory device 10. When receiving a read/write command signal, the control circuit 120 provides address information, received through the address terminal 14, to the pre-decoder 13. The control circuit 120 enables the decoders 111-2~111-n corresponding to the respective erase blocks to select the memory cells of the main erase blocks 110-2~110-n indicated by the address information.

The control circuit 120 controls an error correction circuit 123 to generate a parity bit for the data received through a data input terminal (not illustrated) in a read operation. Also, the control circuit 120 stores the received data and the parity bit, generated by the error correction circuit 123, in selected memory cells (a data cell and a parity cell) of the erase block.

The parity bit and the data of the memory cell selected in the read operation is transmitted to a read circuit 122 in response to the control of the control circuit 120. The control circuit 120 controls the error correction circuit 123 to perform an ECC-based error correction operation on the read data and the parity bit. Thereafter, the error-corrected data are outputted through the data output terminal 15 to an external device in response to the control of the control circuit 120.

The error correction circuit 123 may correct an n-bit error and may detect an m-bit error (m>n). For example, in the case of an error correction operation based on a Humming code, the error correction circuit 123 may correct a 1-bit error and may detect a 2-bit error. An exemplary embodiment of the inventive concepts is described with the assumption that the number of error-correctable bits is n. Also, in the case of an error correction operation based on a Humming code, the relationship between an error correction bit and a parity bit is exemplified as follows: in the case of correcting an error in 64 bits, 7-bit parity cells are required for n=1 and 12-bit parity cells are required for n=2.

The number 'n' of error-correctable bits depends on the number of bits of a parity cell in a design stage. However, an increase in the number 'n' of error-correctable bits causes an increase in the chip size due to the large number of parity cells that need be included in the chip. Also, a defective block is typically replaced with a redundant block if the number of error bits in an erase block exceeds the number of error-correctable bits (n bits). This, however, reduces a read operation speed because an operation of determining which defective block to replace is performed in a read operation.

In this context, the semiconductor memory device 10 determines an erase block to be replaced with a redundant block, before the start of an erase operation after the input of an erase operation command. To this end, the control unit 12 includes a dummy read control circuit 121, a fuse renewal circuit 124 and a redundant replacement fuse 125 as illustrated in FIG. 1. The dummy read control circuit 121 and the fuse renewal circuit 124 are controlled by the control circuit 120. The error correction circuit 123 controls the redundant replacement fuse 125 in response to a command signal received from the control circuit 120. That is, the redundant replacement fuse 125 is controlled by the error correction circuit 123.

When the semiconductor memory device 10 performs an erase operation, the dummy read control circuit 121 enables the read circuit 122 in response to an erase control signal received from the control circuit 120.

The fuse renewal circuit 124 is enabled in response to an error detection signal received from the error correction circuit 123. The fuse renewal circuit 124 electrically cuts (opens) the fuse of the redundant replacement fuse 125 corresponding to one of the block numbers (block coordinates) of the main erase blocks 110-2~110-n. Accordingly, when receiving an address selecting an n-bit error-uncorrectable erase block in a read/write operation, the control circuit 120 selects the redundant erase block 110-1 instead of the corresponding main erase block according to the logic level (0 or 1) indicated by the electrically-cut fuse.

In an erase operation, the error correction circuit 123 selects one of the main erase blocks 110-2~110-n and performs an error detection operation by the check bit (parity bit) and the data (information bit) read from the selected main erase block through a dummy read. When detecting the error bits of more than n bits from the data of each error correction unit read through the dummy read operation on the main erase block, the error correction circuit 123 determines the corresponding erase block to be an n-bit error-uncorrectable erase block (an ECC overflow block). The error correction circuit 123 outputs an error detection signal to the fuse renewal circuit 124.

An error correction operation in the erase operation mode of the semiconductor memory device 10 according to an exemplary embodiment of the inventive concepts will be described below with reference to FIGS. 1 and 2.

Figure 2:
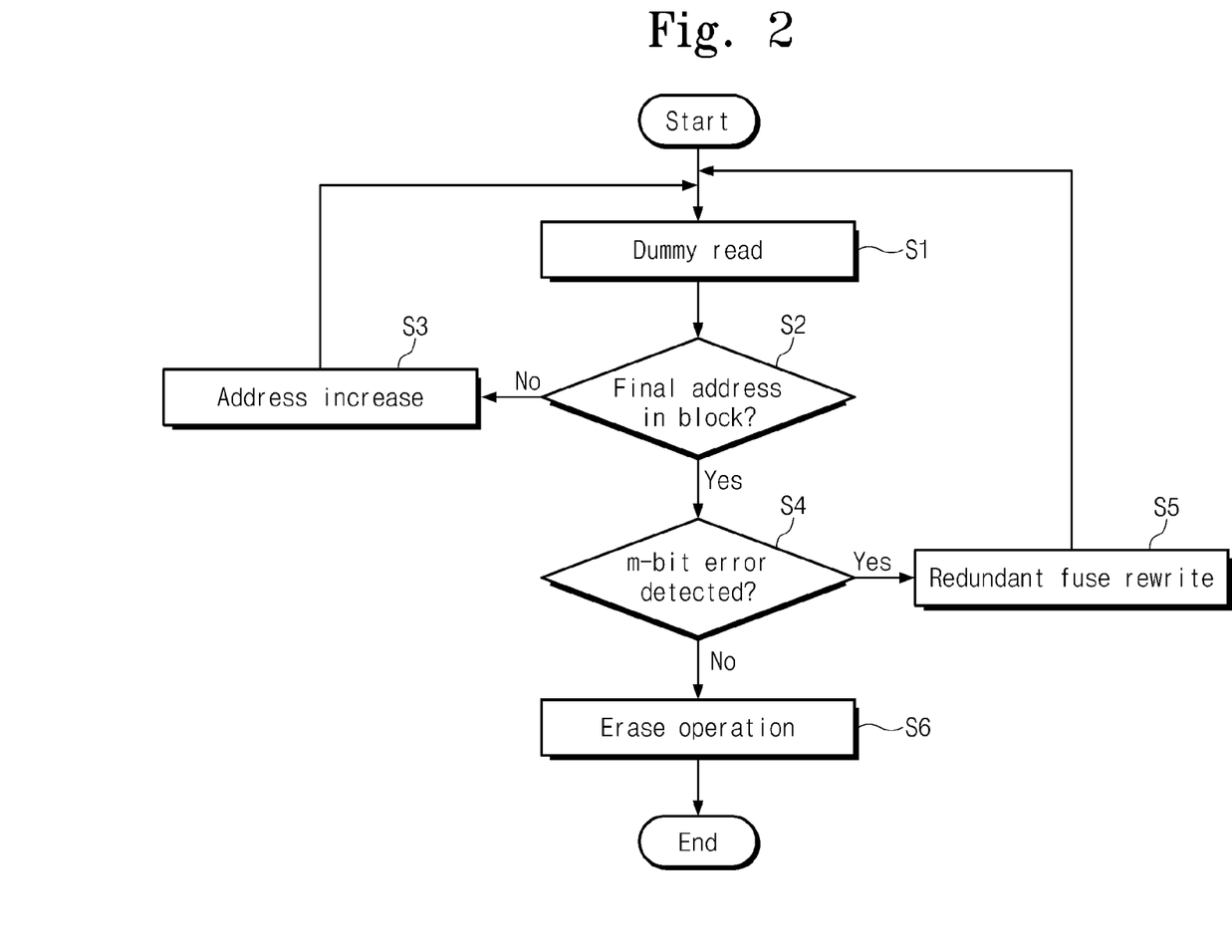
FIG. 2 is a flow chart illustrating a block replacement operation of a semiconductor memory device according to an exemplary embodiment of the inventive concepts.

FIG. 2 is a flow chart illustrating a block replacement operation of a semiconductor memory device according to an exemplary embodiment of the inventive concepts.

Referring to FIGS. 1 and 2, in an erase mode, the control unit 12 performs a dummy read operation (step S1). That is, when receiving an erase operation command (an erase command) from the command input terminal 16, the control unit 12 performs a dummy read operation. Specifically, when receiving an erase control signal, the control unit 12 enables the read circuit 122. For reference, the read circuit 122 is typically enabled in a read operation. Also, the control circuit 120 outputs a control signal for enabling the error correction circuit 123. The error correction circuit 123 is enabled by the control signal of the control circuit 120. Thereafter, the error correction circuit 123 performs an error correction operation on the data read from an erase block by the read circuit 122.

The control circuit 120 drives the decoder corresponding to a selected erase block. For example, when erasing the main erase block 110-2, the control circuit 120 drives the corresponding decoder 111-2. The control circuit 120 may include an address counter. The control circuit 120 uses the address counter to control the pre-decoder 13 to sequentially select the memory cells corresponding to the lowest to highest addresses in the erase block. At this point, the control circuit 120 controls the read circuit 122 to output data (information bits) and check bits (parity bits) to the error correction circuit 123.

The dummy read operation (step S1) is repeated by incrementing the read address (step S3) so long as the dummy read address is not the final address in the erase block (i.e., NO at step S2). On the other hand, an error correction operation is performed on all the memory cells of the erase block if the dummy address is the final address in the erase block (YES in step S2). At this point, with respect to each of the data sequentially read from the erase block by the read circuit 122, the error correction circuit 123 uses each of the parity bits to determine whether it exceeds the number 'n' of error-correctable bits (step S4).

If an m-bit error (m>n) is detected, the error correction circuit 123 performs a rewrite operation of the redundant replacement fuse 125 (step S5).

Specifically, the error correction circuit 123 outputs an error detection signal to the fuse renewal circuit 124. Thereafter, in response to the error detection signal, the fuse renewal circuit 124 electrically cuts the fuse (among the fuses in the redundant replacement fuse 125) indicating the block coordinates related to the current erase operation.

Accordingly, when receiving a read/write/erase command and receiving address information for the error-detected erase block, the control circuit 120 selects the redundant block instead of the n-bit error-uncorrectable erase block (ECC overflow block).

On the other hand, if an m-bit error (m>n) is not detected, an erase operation is performed on the corresponding erase block (step S6).

Also, after the rewrite operation of the redundant replacement fuse 125 (step S5), the subsequent operations are repeated from the dummy read operation (step S1) in order to determine the existence/nonexistence of an error in the replacement redundant block. Accordingly, it can be determined whether an m-bit error (m>n) is detected in the replacement redundant block.

As described above, a nonvolatile semiconductor memory device according to an exemplary embodiment of the inventive concepts includes a memory region including memory cells arranged to store data, and a redundant region for replacing the memory region if the memory region is a defective region. The nonvolatile semiconductor memory device also includes a control unit performing an error detection operation on data read from the memory region before an erase operation in the event of the input of an erase operation command, and detecting the defective region replaced with the redundant region according to the error detection result.

The control unit of the example embodiment includes an error correction circuit performing an error detection/correction operation on the data read from the memory region, an error correction region coordinate memory unit memorizing/storing/retaining the coordinates of the defective region if the number of detected error bits exceeds the number of error-correctable bits, and a control circuit selecting the redundant region instead of the memory region indicated by the coordinates of the defective region memorized/stored/retained in the error correction region coordinate memory unit in the event of the input of a read/write operation command.

As described above, a semiconductor memory device according to an exemplary embodiment of the inventive concepts is configured to replace a memory region, in which the number of detected error bits exceeds the number of error-correctable bits, with a redundant block. Therefore, the inventive concepts can reduce the occurrence probability of an ECC overflow. Accordingly, the inventive concepts can increase the write/erase count limit of the product, thus increasing the product reliability. Also, the nonvolatile semiconductor memory device according to the exemplary embodiment of the inventive concepts can replace an ECC overflow block with a redundant block by performing an ECC-based error correction operation in an erase operation mode where an erase command is inputted. Therefore, the read operation speed can increase because an ECC overflow block is not replaced with a redundant block in a read operation. Accordingly, the semiconductor memory device according to the exemplary embodiment of the inventive concepts can perform a relatively high-speed read operation.

Although the inventive concepts has been described with reference to exemplary embodiments thereof, those skilled in the art will readily understand that the inventive concepts are not limited to the exemplary embodiments, and various changes in form and details may be made therein without departing from the spirit and scope of the inventive concept. For example, although the redundant unit of the replacement redundant region in the nonvolatile memory devices according to the exemplary embodiments of the inventive concepts is referred to as the erase block, it may also be another redundant unit such as a word line unit.

Hereinafter, an exemplary embodiment of the inventive concepts will be described with reference to a flash memory device. That is, in this example, it is assumed that a semiconductor memory device according to an exemplary embodiment of the inventive concepts is a flash memory device.

A flash memory device according to an exemplary embodiment of the inventive concepts may be applicable to various products. For example, a flash memory device according to an exemplary embodiment of the inventive concepts may be used to implement not only electronic devices such as personal computers, digital cameras, camcorders, mobile phones, MP3 players, PMPs, PSPs and PDAs, but also storage devices such as memory cards, USB memory devices and solid state drives (SSDs).

Figure 3:
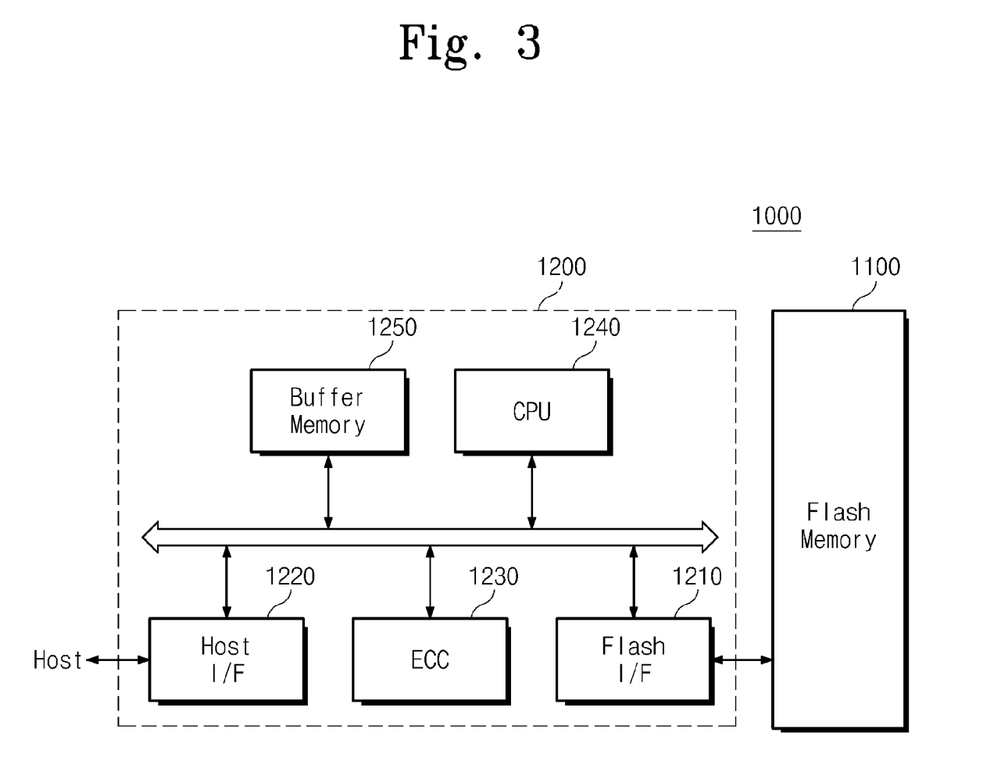
FIG. 3 is a block diagram of a memory system including a flash memory device according to an exemplary embodiment of the inventive concepts.

FIG. 3 is a block diagram of a memory system including a flash memory device according to an exemplary embodiment of the inventive concept.

Referring to FIG. 3, a memory system 1000 includes a flash memory device 1100 and a memory controller 1200.

The flash memory device 1100 and the memory controller 1200 may be included in one storage device. The storage device may also include mobile storage devices such as USB memory devices and memory cards (e.g., MMCs, SD cards, xD cards, CF cards, and SIM cards). The storage device may also be connected to hosts such as computers, notebook computers, digital cameras, mobile phones, MP3 players, PMPs, and games.

The flash memory device 1100 can replace a memory region, in which the number of detected error bits exceeds the number of error-correctable bits, with a redundant block. Therefore, the flash memory device 1100 can reduce the occurrence probability of an ECC overflow. Accordingly, the flash memory device 1100 can increase the write/erase count limit of the product. Also, the flash memory device 1100 can replace an ECC overflow block with a redundant block by performing an ECC-based error correction operation in an erase operation mode where an erase command is inputted. Therefore, the read operation speed can increase because an ECC overflow block is not replaced with a redundant block in a read operation. Accordingly, the flash memory device 1100 can perform a high-speed read operation.

The memory controller 1200 includes a flash interface (I/F) 1210, a host interface (I/F) 1220, an ECC circuit 1230, a central processing unit (CPU) 1240, and a buffer memory 1250.

The flash interface 1210 is used to exchange commands, addresses and data with the flash memory device 1100. That is, the flash interface 1210 provides a read command and an address in a read operation and provides a write command, an address and data in a write operation. The host interface 1220 is used to receive a write/read request from a host and provide data in response to a request of the host.

The ECC circuit 1230 generates parity bits (or ECC data) by using data transmitted to the flash memory device 1100. The generated parity bits are stored in a spare region of the flash memory device 1100. The ECC circuit 1230 detects an error in data read from the flash memory device 1100. If the detected error is within the correctable range, the ECC circuit 1230 corrects the detected error. The ECC circuit 1230 may be located within or externally of the memory controller 1200 according to the type of the memory system 1000.

The CPU 1240 is configured to control a read/write operation of the flash memory device 1100 in response to a request of the host. The buffer memory 1250 may temporarily store data read from the flash memory device 1100 or data received from the host. The buffer memory 1250 may also be used to drive a firmware such as a flash translation layer (FTL). The FTL is operated by the CPU 1240. For example, the buffer memory 1250 may be implemented using DRAMs and/or SRAMs.

The buffer memory 1250 may also store table information necessary to manage read error information. The table information may be stored as metadata in a meta region of the flash memory device 1100 under the control of the CPU 1240. The table information may be copied from the meta region into the buffer memory 1250 in a power-up mode. Although not illustrated in FIG. 3, the memory system 1000 may further include a read-only memory (ROM) that stores code data for interfacing with the host.

Figure 4:
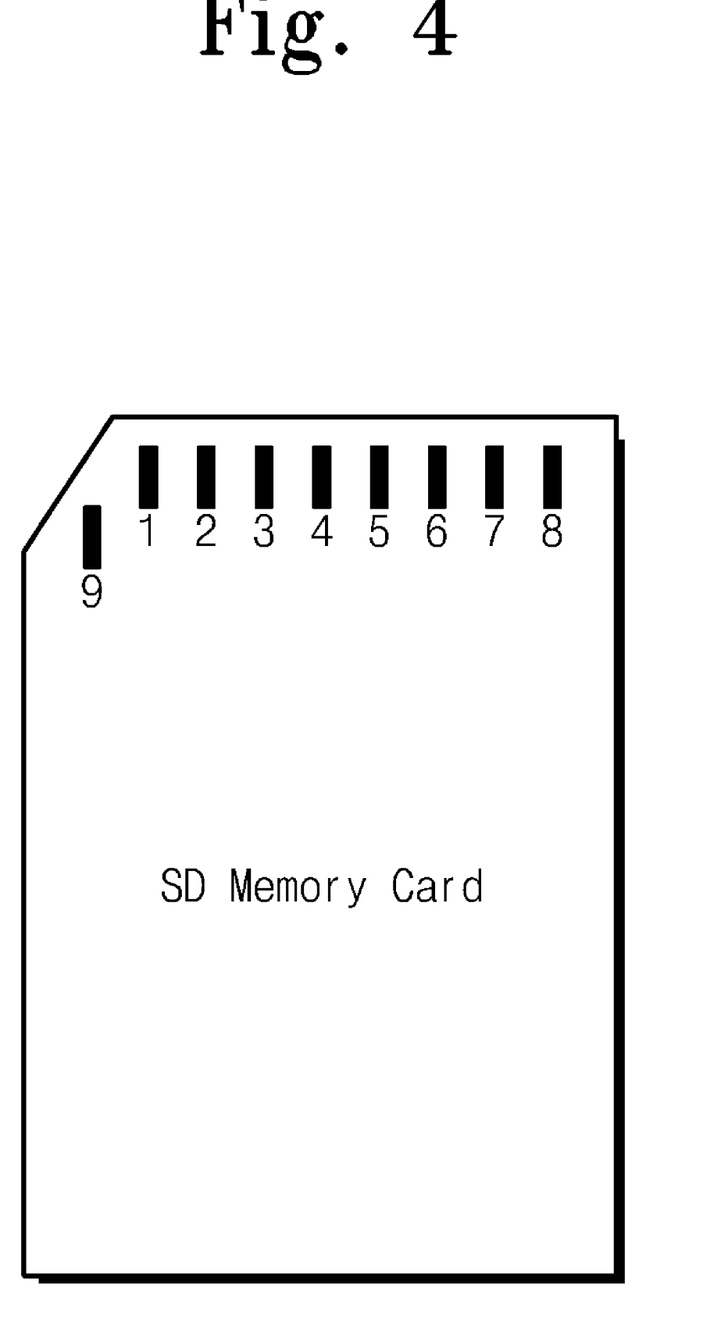
FIG. 4 is a block diagram of a memory card including a flash memory device according to an exemplary embodiment of the inventive concepts.

FIG. 4 is a block diagram of a memory card including a flash memory device according to an exemplary embodiment of the inventive concepts.

FIG. 4 illustrates the external shape of an SD card as an exemplary memory card.

Referring to FIG. 4, the SD card includes 9 pins. The SD card has 4 data pins (e.g., 1, 7, 8 and 9), one command pin (e.g., 2), one clock pin (e.g., 5), and 3 power pins (e.g., 3, 4 and 6).

Herein, command signals and response signals are transferred through the command pin 2. Typically, command signals are transmitted from a host to the memory card, and response signals are transmitted from the memory card to the host.

According to an exemplary embodiment of the inventive concepts, the memory system 1000 may be implemented as a mobile storage device such as an SD card. The memory system 1000 may include a flash memory device 1100 and a memory controller 1200 for controlling the flash memory device 1100.

The flash memory device 1100 can replace a memory region, in which the number of detected error bits exceeds the number of error-correctable bits, with a redundant block. Therefore, the flash memory device 1100 can reduce the occurrence probability of an ECC overflow. Accordingly, the flash memory device 1100 can increase the write/erase count limit of the product. Also, the flash memory device 1100 can replace an ECC overflow block with a redundant block by performing an ECC-based error correction operation in an erase operation mode where an erase command is inputted. Therefore, the read operation speed can increase because an ECC overflow block is not replaced with a redundant block in a read operation. Accordingly, the flash memory device 1100 can perform a high-speed read operation.

Figure 5:
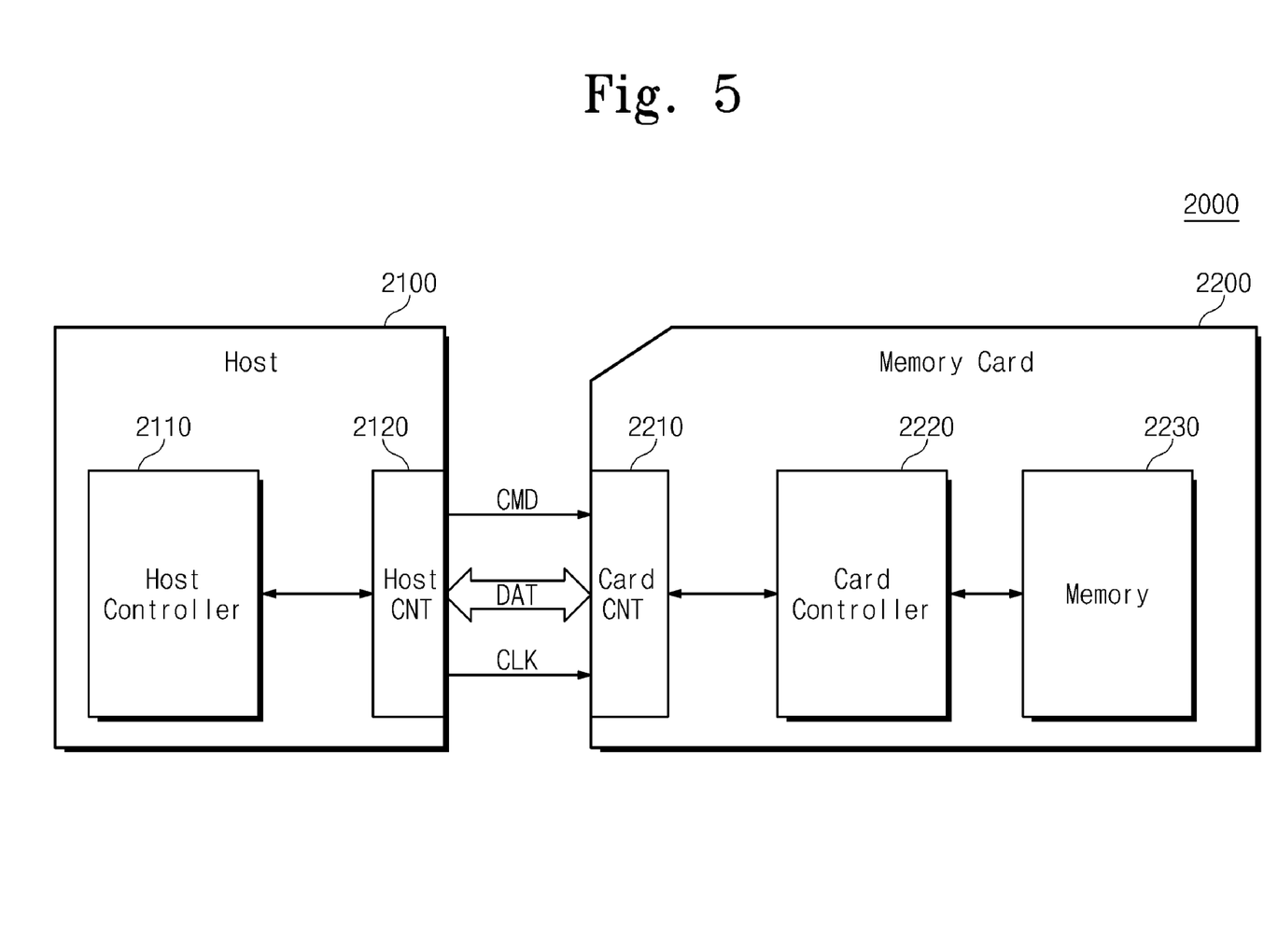
FIG. 5 is a block diagram illustrating the connection with a host and the internal configuration of the memory card illustrated in FIG. 4.

FIG. 5 is a block diagram illustrating the connection with a host and the internal configuration of the memory card illustrated in FIG. 4.

Referring to FIG. 5, a memory card system 2000 includes a host 2100 and a memory card 2200. The host 2100 includes a host controller 2110 and a host connection unit 2120. The memory card 2200 includes a card connection unit 2210, a card controller 2220, and a memory 2230.

The host connection unit 2120 and the card connection unit 2210 include a plurality of pins, examples of which include command pins, data pins, clock pins, and power pins. The number of pins depends on the type of the memory card 2200. For example, an SD card has 9 pins.

The host 2100 writes/reads data in/from the memory card 2200. The host controller 2110 transmits a command (e.g., a write command), a clock signal CLK generated by a clock generator (not illustrated) in the host 2100, and data DAT through the host connection unit 2120 to the memory card 2200.

The card controller 2220 stores data in the memory 2230, in response to a write command received through the card connection unit 2210, in synchronization with a clock signal generated by a clock generator (not illustrated) in the card controller 2220. The memory 2230 stores data received from the host 2100. For example, if the host 2100 is a digital camera, the memory 2230 stores image data.

According to an exemplary embodiment of the inventive concepts, the memory system 1000 may be implemented as the memory card system 2000. The memory system 1000 may include a flash memory device 1100 and a memory controller 1200. The flash memory device 1100 may be implemented as the memory 2230, and the memory controller 1200 may be implemented as the card controller 2220.

The flash memory device 1100 can replace a memory region, in which the number of detected error bits exceeds the number of error-correctable bits, with a redundant block. Therefore, the flash memory device 1100 can reduce the occurrence probability of an ECC overflow. Accordingly, the flash memory device 1100 can increase the write/erase count limit of the product. Also, the flash memory device 1100 can replace an ECC overflow block with a redundant block by performing an ECC-based error correction operation in an erase operation mode where an erase command is inputted. Therefore, the read operation speed can increase because an ECC overflow block is not replaced with a redundant block in a read operation. Accordingly, the flash memory device 1100 can perform a high-speed read operation.

Figure 6:
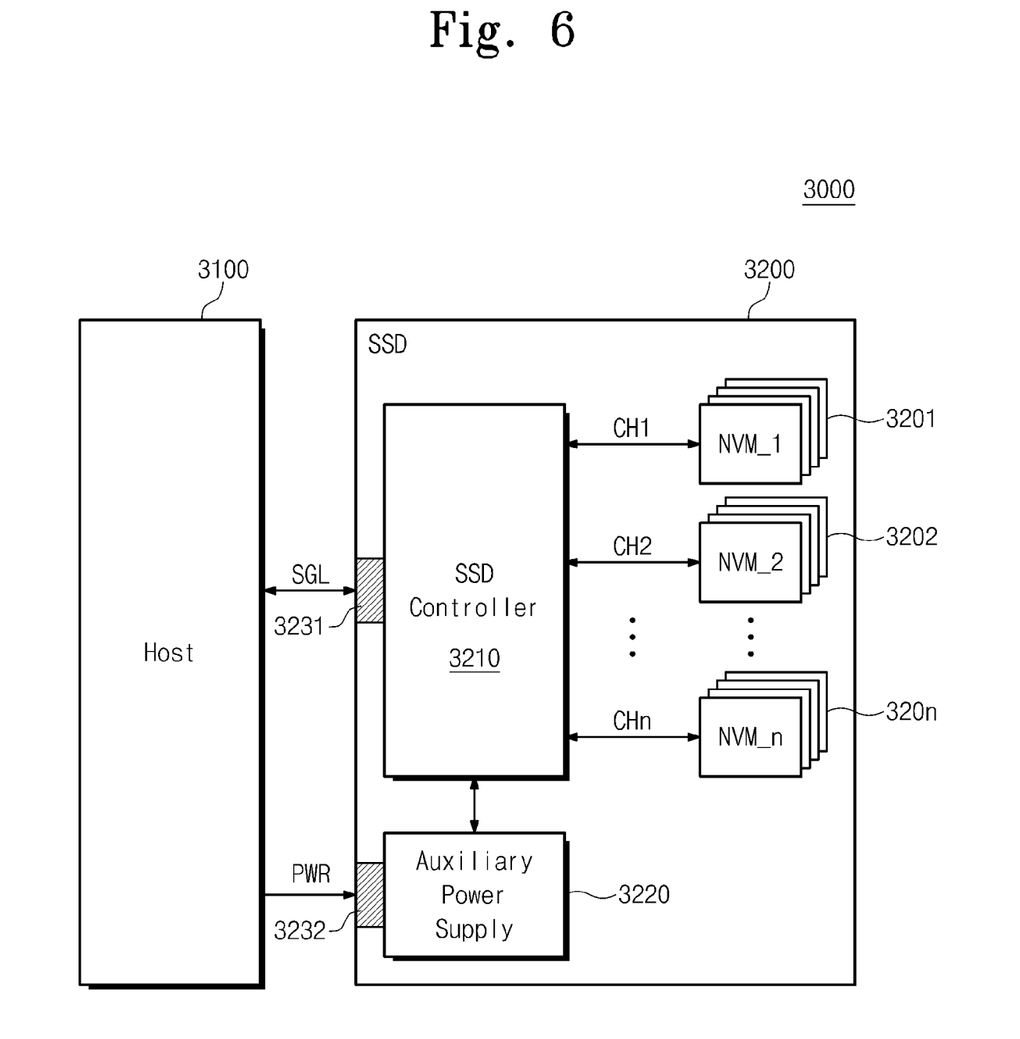
FIG. 6 is a block diagram of a solid state drive (SSD) system including a flash memory device according to an exemplary embodiment of the inventive concepts.

FIG. 6 is a block diagram of a solid state drive (SSD) system including a flash memory device according to an exemplary embodiment of the inventive concepts.

Referring to FIG. 6, an SSD system 3000 includes a host 3100 and an SSD 3200. The SSD 3200 communicates signals with the host 3100 through a signal connector 3231, and receives power through a power connector 3232. The SSD 3200 includes a plurality of nonvolatile memory (NVM) devices 3201~320n, an SSD controller 3210, and an auxiliary power supply 3220.

The nonvolatile memory devices 3201~320n are used as a storage medium of the SSD 3200. The nonvolatile memory devices 3201~320n may be implemented using flash memory devices with a large storage capacity. The SSD 3200 generally uses flash memories, and may also use other nonvolatile memory devices such as PRAMs, MRAMs, ReRAMs, and FRAMs.

The nonvolatile memory devices 3201~320n may be connected through a plurality of channel CH1~CHn to the SSD controller 3210. One or more memory devices may be connected to each channel. The memory devices connected to one channel may be connected to the same data bus.

The SSD controller 3210 communicates signals SGL with the host 3100 through the signal connector 3231. Herein, the signals SGL may include commands, addresses, and data. According to the commands of the host 3100, the SSD controller 3210 writes/reads data in/from the corresponding memory devices. The internal structure of the SSD controller 3210 will be described below in detail with reference to FIG. 7.

The auxiliary power supply 3220 is connected through the power connector 3232 to the host 3100. The auxiliary power supply 3220 may be charged by receiving power PWR from the host 3100. The auxiliary power supply 3220 may be located within or externally of the SSD 3200. For example, the auxiliary power supply 3220 may be located in the main board to supply auxiliary power to the SSD 3220.

According to an exemplary embodiment of the inventive concept, the memory system 1000 may be implemented as the SSD system 3000. The memory system 1000 may include a flash memory device 1100 and a memory controller 1200 for controlling the flash memory device 1100. The flash memory device 1100 may be implemented using a plurality of nonvolatile memory devices 3201~320n, and the memory controller 1200 may be implemented as the SSD controller 3210.

The flash memory device 1100 can replace a memory region, in which the number of detected error bits exceeds the number of error-correctable bits, with a redundant block. Therefore, the flash memory device 1100 can reduce the occurrence probability of an ECC overflow. Accordingly, the flash memory device 1100 can increase the write/erase count limit of the product. Also, the flash memory device 1100 can replace an ECC overflow block with a redundant block by performing an ECC-based error correction operation in an erase operation mode where an erase command is inputted. Therefore, the read operation speed can increase because an ECC overflow block is not replaced with a redundant block in a read operation. Accordingly, the flash memory device 1100 can perform a high-speed read operation.

Figure 7:
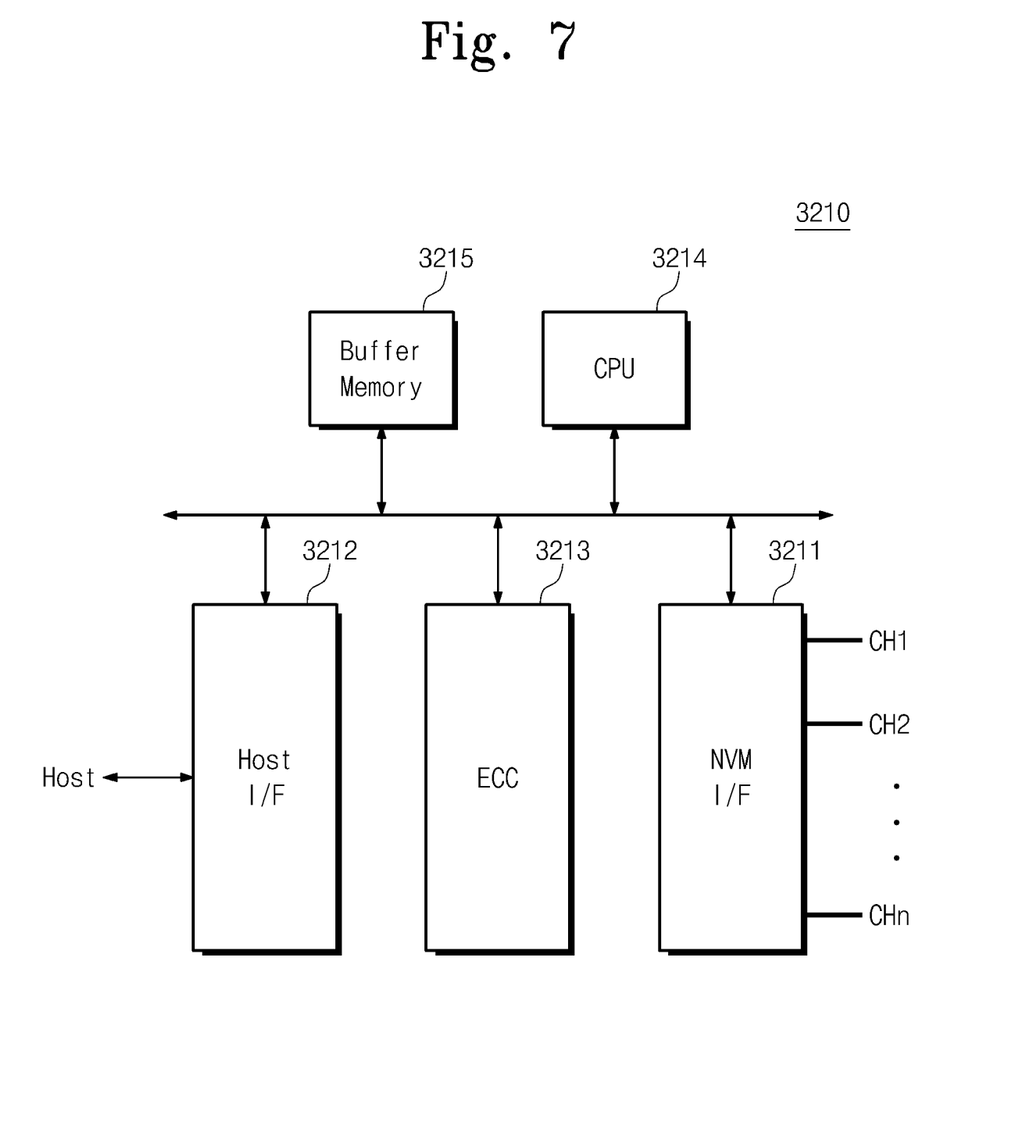
FIG. 7 is a block diagram of an SSD controller illustrated in FIG. 6.

FIG. 7 is a block diagram of the SSD controller 3210 illustrated in FIG. 6.

Referring to FIG. 7, the SSD controller 3210 includes a nonvolatile memory (NVM) interface (I/F) 3211, a host interface (I/F) 3212, an ECC circuit 3213, a central processing unit (CPU) 3214, and a buffer memory 3215.

The NVM interface 3211 scatters data, received from the buffer memory 3215, through respective channels CH1~CHn. The NVM interface 3211 transfers data, read from the nonvolatile memory devices 3201~320n, to the buffer memory 3215. Herein, the NVM interface 3211 may use a NAND flash memory interface scheme. That is, the SSD controller 3210 may perform an erase/write/read operation according to a NAND flash memory interface scheme.

The host interface 3212 provides an interface with the SSD 3200 in accordance with the protocol of the host. The host interface 3212 may communicate with the host by means of Universal Serial Bus (USB), Small Computer System Interface (SCSI), PCI Express, ATA, Parallel ATA (PATA), Serial ATA (SATA), or Serial Attached SCSI (SAS). Also, the host interface 3212 may perform a disk emulation function that assists the host to recognize the SSD 3200 as a hard disk drive (HDD).

The ECC circuit 3213 generates parity bits by using data transmitted to the nonvolatile memory devices 3201~320n. The generated parity bits are stored in a spare region of the nonvolatile memory devices 3201~320n. The ECC circuit 3213 detects an error in data read from the nonvolatile memory devices 3201~320n. If the detected error is within the correctable range, the ECC circuit 3213 corrects the detected error.

The CPU 3214 analyzes and processes signals SGL received from the host. The CPU 3214 controls the host or the nonvolatile memory devices 3201~320n through the host interface 3212 or the NVM interface 3211. The CPU 3214 controls the operations of the nonvolatile memory devices 3201~320n according to the firmware for driving the SSD 3200.

The buffer memory 3215 may temporarily store data received from the host or data read from the nonvolatile memory devices 3201~320n. The buffer memory 3215 may also store cache data or metadata to be stored in the nonvolatile memory devices 3201~320n. In a sudden power-off operation, the cache data or the metadata stored in the buffer memory 3215 may be stored in the nonvolatile memory devices 3201~320n. For example, the buffer memory 3215 may include DRAMs and/or SRAMs.

Figure 8:
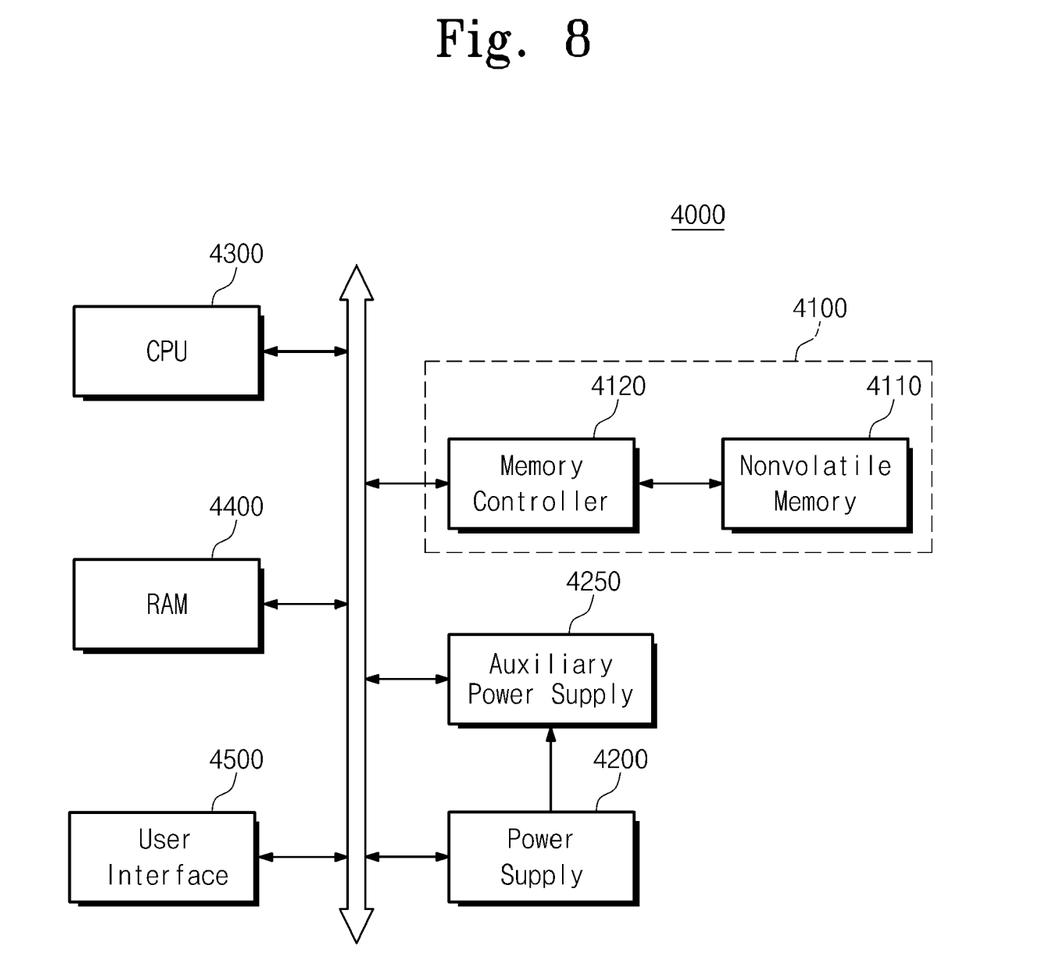
FIG. 8 is a block diagram of an electronic apparatus including a flash memory device according to an exemplary embodiment of the inventive concepts.

FIG. 8 is a block diagram of an electronic apparatus including a flash memory device according to an exemplary embodiment of the inventive concepts.

Examples of the electronic device include personal computers (PCs) and portable electronic devices such as notebook computers, mobile phones, personal digital assistants (PDAs) and cameras.

Referring to FIG. 8, an electronic apparatus 4000 includes a memory system 4100, a power supply unit 4200, an auxiliary power supply unit 4250, a central processing unit (CPU) 4300, a random-access memory (RAM) 4400, and a user interface 4500. The memory system 4100 includes a flash memory device 4110 and a memory controller 4120.

According to an exemplary embodiment of the inventive concepts, the memory system 1000 may be implemented as the memory system 4100 of the electronic apparatus 4000. The memory system 1000 may include a flash memory device 1100 and a memory controller 1200 for controlling the flash memory device 1100. The flash memory device 1100 may be implemented as the flash memory device 4110 of the electronic apparatus 4000, and the memory controller 1200 may be implemented as the memory controller 4120 of the electronic apparatus 4000.

As described above, the flash memory device 1100 can replace a memory region, in which the number of detected error bits exceeds the number of error-correctable bits, with a redundant block. Therefore, the flash memory device 1100 can reduce the occurrence probability of an ECC overflow. Accordingly, the flash memory device 1100 can increase the write/erase count limit of the product. Also, the flash memory device 1100 can replace an ECC overflow block with a redundant block by performing an ECC-based error correction operation in an erase operation mode where an erase command is inputted. Therefore, the read operation speed can increase because an ECC overflow block is not replaced with a redundant block in a read operation. Accordingly, the flash memory device 1100 can perform a high-speed read operation.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A semiconductor memory device comprising:
a memory region including memory cells configured to store data;
a redundant region including memory cells configured to store data; and
a control unit which is responsive to an erase command to execute, prior to an erase operation corresponding to the erase command, an error detection operation on data read from the memory region to detect whether the memory region is a defective memory region to be replaced by the redundant region,
wherein the control unit comprises:
an error correction circuit for performing an error detection/correction operation on the data read from the memory region;
an error correction region coordinate memory unit for storing coordinates of the memory region when a number of detected error bits exceeds a number of error-correctable bits in the error detection/correction operation, whereby the memory region is a defective memory region; and
a control circuit for selecting the redundant region, instead of the memory region, indicated by the coordinates stored in the error correction region coordinate memory unit in response to the input of a read/write operation command.

2. A semiconductor memory device comprising:
a memory cell array including a memory region and a redundant region;
a decoder for selecting memory blocks of the memory cell array according to an external address; and
a control unit which is responsive to an erase command to detect that the memory region is a defective memory region, before execution of an erase operation corresponding to the erase command, and to control the decoder to replace the defective memory region with the redundant region,
wherein the control unit detects an error in data read from the memory region, and changes coordinates of the memory region into coordinates of the redundant region when a number of detected error bits exceeds a number of error-correctable bits.

3. The semiconductor memory device of claim 2, wherein the control unit includes a fuse circuit for selectively interrupting access to the defective memory region.

4. The semiconductor memory device of claim 3, wherein the control unit electrically cuts a fuse of the fuse circuit when detecting that the memory region is the defective memory region.

5. The semiconductor memory device of claim 4, wherein the control unit controls the decoder to select the redundant region in accordance with a logic level indicated by the fuse in response to the input of an address of the defective memory region.

6. The semiconductor memory device of claim 2, wherein the number of error-correctable bits is dependent upon a number of parity bits in an error correction operation.

7. The semiconductor memory device of claim 2, wherein the redundant region includes a plurality of redundant memory blocks.

8. A semiconductor memory device comprising:
a main memory block;
a redundant memory block; and
a control unit which is responsive to an erase command to determine, before execution of an erase operation corresponding to the erase command, whether the main memory block is defective, and to interrupt an access to the main memory block and select the redundant memory block when the main memory block is determined to be defective.

9. The semiconductor memory device of claim 8, wherein, in response to the erase command, the control unit detects an error in data read from the main memory block through a dummy read operation and determines that the main memory block is defective when a number of detected error bits of the detected error exceeds a number of error-correctable bits.

10. The semiconductor memory device of claim 8, wherein the control unit includes a fuse circuit storing coordinate information of the defective main memory block.

11. The semiconductor memory device of claim 10, wherein the control unit replaces the defective main memory block with the redundant memory block with reference to the coordinate information.

12. The semiconductor memory device of claim 10, wherein the fuse circuit stores the coordinate information by electrically cutting a fuse corresponding to the defective main memory block.

* * * * *